United States Patent
Hinow et al.

(10) Patent No.: US 9,465,085 B2
(45) Date of Patent: Oct. 11, 2016

(54) TEST SYSTEM AND METHOD FOR TESTING HIGH-VOLTAGE TECHNOLOGY

(71) Applicants: Martin Hinow, Dresden (DE); Uwe Stephan, Freital (DE); Guenther Siebert, Dresden (DE); Ralf Bergmann, Dohna (DE); Andreas Thiede, Schoenborn/Langebrueck (DE)

(72) Inventors: Martin Hinow, Dresden (DE); Uwe Stephan, Freital (DE); Guenther Siebert, Dresden (DE); Ralf Bergmann, Dohna (DE); Andreas Thiede, Schoenborn/Langebrueck (DE)

(73) Assignee: MASCHINENFABRIK REINHAUSEN GMBH, Regensburg (DE)

( * ) Notice: Subject to any disclaimer, the term of this patent is extended or adjusted under 35 U.S.C. 154(b) by 51 days.

(21) Appl. No.: 14/372,112
(22) PCT Filed: Jan. 15, 2013
(86) PCT No.: PCT/EP2013/050623
§ 371 (c)(1),
(2) Date: Jul. 15, 2014
(87) PCT Pub. No.: WO2013/127555
PCT Pub. Date: Sep. 6, 2013

(65) Prior Publication Data
US 2015/0008944 A1 Jan. 8, 2015

(30) Foreign Application Priority Data
Feb. 27, 2012 (DE) .................. 10 2012 101 548

(51) Int. Cl.
*G01R 31/00* (2006.01)
*G01R 31/40* (2014.01)
(Continued)

(52) U.S. Cl.
CPC .............. *G01R 31/40* (2013.01); *G01R 1/20* (2013.01); *G01R 31/00* (2013.01); *G01R 31/02* (2013.01); *G01R 31/14* (2013.01); *G01R 31/42* (2013.01)

(58) Field of Classification Search
CPC ...... G01R 31/40; G01R 31/00; G01R 31/02; G01R 31/021; G01R 31/14; G01R 31/42; G01R 1/20; G01R 31/20; G01R 31/04
USPC ....... 324/54, 57 R, 541, 543, 544, 551, 555, 324/750.01
See application file for complete search history.

(56) References Cited

U.S. PATENT DOCUMENTS 3,259,762 A * 7/1966 Skuderna ................ H02J 11/00
174/2
3,781,667 A 12/1973 Tuttle
(Continued)

FOREIGN PATENT DOCUMENTS

| CH | 250411 B | 8/1947 |
|---|---|---|
| DE | 373353 B | 4/1923 |
| DE | 737433 B | 7/1943 |

*Primary Examiner* — Arleen M Vazquez
*Assistant Examiner* — Steven Yeninas
(74) *Attorney, Agent, or Firm* — Andrew Wilford

(57) ABSTRACT

The present invention relates to a test system for high-voltage technology devices, in particular shunt reactors, as defined in the preamble of independent patent claim 1. The invention also relates to a method which can be carried out with this test system and is intended to test high-voltage technology devices according to coordinate patent claim 5. The general idea of the test system according to the invention is to provide a continuously adjustable inductance and a capacitance, which can be adjusted in discrete steps, on the secondary side of the test transformer in such a manner that said components form a series resonant circuit together with the test object in the form of an inductance. In the method which can be carried out with the test system according to the invention, a rough adjustment of the test system is carried out using the discretely adjustable capacitances of the capacitor bank by connecting individual capacitances of the capacitor bank via an iterative process if an undercapacitance is measured in the test system by means of a measuring device or by disconnecting individual capacitances if an overcapacitance is measured by means of the measuring device until a predefined threshold value of an overcapacitance prevails, with the result that fine tuning of the test system is then carried out by means of the continuously adjustable inductance in such a manner that said components form, together with the test object in the form of an inductance, a series resonant circuit which can be tuned to the point of resonance thereof.

5 Claims, 1 Drawing Sheet

(51) Int. Cl.
  *G01R 1/20* (2006.01)
  *G01R 31/42* (2006.01)
  *G01R 31/02* (2006.01)
  *G01R 31/14* (2006.01)

(56) References Cited

U.S. PATENT DOCUMENTS

| | | | | |
|---|---|---|---|---|
| 3,895,295 A | * | 7/1975 | Mittelmann | G01R 21/00 324/142 |
| 4,338,561 A | * | 7/1982 | Zaengl | G01R 31/14 323/208 |
| 5,128,620 A | | 7/1992 | McArdle | |
| 5,194,817 A | * | 3/1993 | Ward | G01R 31/1272 324/544 |
| 7,602,256 B2 | * | 10/2009 | Talwalkar | H03L 7/099 331/36 C |
| 8,643,381 B2 | | 2/2014 | Werle | |
| 2003/0146803 A1 | * | 8/2003 | Pickard | H03H 7/38 333/32 |
| 2005/0046359 A1 | * | 3/2005 | Alexandrov | H05B 41/2813 315/248 |
| 2012/0250370 A1 | * | 10/2012 | Taniguchi | H02M 3/33561 363/34 |

* cited by examiner

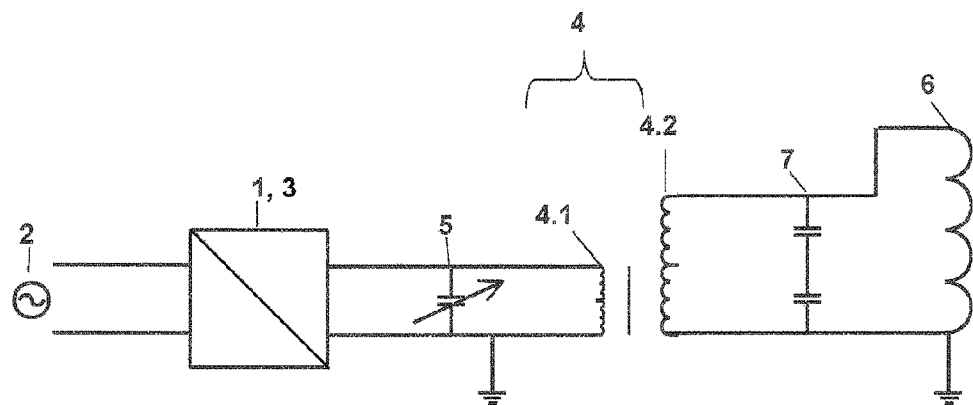
Fig. 1 -- prior art
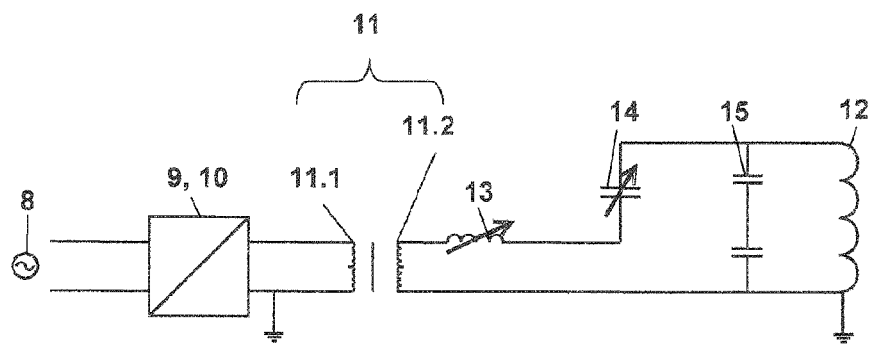
Fig. 2

TEST SYSTEM AND METHOD FOR TESTING HIGH-VOLTAGE TECHNOLOGY

CROSS REFERENCE TO RELATED APPLICATIONS

This application is the US-national stage of PCT application PCT/EP2013/050623 filed 15 Jan. 2013 and claiming the priority of German patent application 102012101548.1 itself filed 27 Feb. 2012.

FIELD OF THE INVENTION

The present invention relates to a test system for a high-voltage apparatus, particularly shunt reactors, having an energy source for electrical supply of the test system, a motor-generator set electrically connected with the energy source for varying frequency and voltage within the test system, and a test transformer having a primary electrically connected with the motor-generator set and a secondary electrically connected with the actual test object. The invention further relates to a method that can be performed by this test system, for testing a high-voltage apparatus.

BACKGROUND OF THE INVENTION

Shunt reactors, also known as compensation choke coils, are sufficiently familiar to the expert from the prior art and are in that case focused on medium-voltage and high-voltage mains for improvement of stability and economy of energy transmission systems. They essentially comprise a coil with at least one winding and an iron core displaceable between the windings of the coil for controlling inductance. These apparatuses from energy technology provide compensation for the capacitive reactive powers of transmission lines, particularly in lightly loaded or idle running transmission mains. Shunt reactors reduce mains-frequency over-voltages in the case of sudden drop in load or transmission mains in idle running. In a test system for a high-voltage apparatus a compensation choke coil represents an inductance to be checked.

The high-voltage test checks whether the compensation choke coil was correctly produced in terms of quality. In that case, a so-called surge voltage check has in principle the purpose of simulating transient over-voltages in three-phase mains by artificially generated pulse-like surges. A substantially more wide-ranging area is represented by tests with alternating voltage. The test object is in that case acted on by an alternating voltage. In this way it is possible, for example, to check the linearity of the compensation choke coil, its vibration and noise behavior, or temperature coefficients. Further significant elements are loss-power measurement and induced voltage testing by partial discharge measurement. The last-mentioned test delivers a decisive statement about the quality of the high-voltage insulation of the compensation choke coil.

The requirements, forms of voltage and determination of the parameters thereof are defined in IEC 60060-1, IEC 60076-3 and IEC 60076-6.

A test system known from the prior art for shunt reactors such as defined by the preamble of the applicable main claim is shown in FIG. 1. This test system is particularly suitable for testing shunt reactors and comprises a motor-generator set 1 electrically supplied by a supply source 2. Within the test system, the motor-generator set 1 has the task within the test system of adapting and regulating the frequency and voltage for the test system. As an alternative to the motor-generator set it is also possible to provide a frequency converter 3 connected by the inputs thereof with an energy source 2, for example the power mains. The outputs of the motor-generator set 1 or alternatively of the frequency converter 3 are in that case connected with the primary 4.1 of a test transformer 4. A compensation unit, here a variable capacitor 5, is interposed in the connecting line between the outputs of the motor-generator set 1 or of the frequency converter 3. The actual test object, namely the shunt reactor, shown in the electrical circuit diagram as an inductor, is connected with the secondary 4.2 of the test transformer. In order to reduce the voltage at the test object 6 to measurable values, a voltage divider 7 is provided between the test object 6 and the secondary 4.2 of the test transformer 4 that is connected with an unillustrated evaluating unit. All these mentioned components of a test system known from the prior art for shunt reactors have been known to the relevant expert for decades and, for example, available from the applicant as a test system for a high-voltage apparatus.

In order to be able to test shunt reactors of very high power of, for example, 110 MVA or thereabove it is necessary in the case of the test system known from the prior art to provide a test transformer with equally large electrical parameters, since the test transformer has to be designed for the maximum test voltage. The motor-generator set, which together with the energy source is constructed for electrical power supply of the test transformer, similarly has to be designed for the maximum test voltage. The costs of the test system are essentially determined by the electrical dimensioning of the test transformer. A test transformer designed in that way with an electrical power of up to 110 MVA in that case costs some millions of euros and in addition due to its mass is no longer movable by a crane.

OBJECT OF THE INVENTION

The object of the present invention is therefore to provide a test system for a high-voltage apparatus in which the test transformer in terms of its electrical parameters no longer has to be designed for the maximum test voltage to at most be applied to the test object. Moreover, it is an object of the invention to provide a method that can be performed by this test system.

SUMMARY OF THE INVENTION

This object is attained by a test system for a high-voltage apparatus, particularly shunt reactors, in which a continuously adjustable inductor as well as a capacitor adjustable in discrete steps on the secondary of the test transformer in such a manner that the stated components together with the test object, which forms an inductor, form a series-resonant circuit that is tunable to its resonant frequency. The essential components of the test system are in that case the actual test object, namely the shunt reactor forming an inductor, as well as the capacitor bank representing a capacitor. These two components as well as the adjustable inductor that can be constructed as, for example, an adjustable choke, form in accordance with the essence of the invention in their mutual interaction a series resonance circuit supplied by an energy source and a motor-generator set. In order to tune the frequency of the test system to the resonant frequency of the capacitor that is adjustable in discrete steps, of the capacitive bank, the test object forming an inductor and the inductor, which is continuously adjustable, of the adjustable choke are tuned to one another, which takes place in accordance with the steps of the method according to the invention described in the following. Thus, the test transformer previously matched in its electrical parameters to the test object can be constructed to be significantly smaller and more economical. In accordance with the essence of the invention a test transformer with a power of only 4 MVA is sufficient for a shunt reactor of 110 MVA. Not only can the test transformer be thus dimensioned for smaller power, but also the motor-generator set for supply of the test system, which previously had to provide all the power imposed on the test system, can be adapted to the outline parameters varying in accordance with the invention. The overall costs for the test system are thus significantly reduced in comparison with the prior art.

In order to be able to propose a method performable by the test system according to the invention the following technical problem would additionally have to be solved: the electrical parameters of the test object, particularly the inductance thereof, are in that case invariable and form a constant within the test system. At the same time, in the case of the electrical parameters of the test object it is necessary to take into account, due to production tolerances, a departure of up to 5% from target values, so that the outline parameters of the test system cannot be readily provided in advance and thus preset. The frequency converter of the test system can in that case produce variable frequencies of up to 200 Hz, in which case two frequencies are of importance for the test:

induced voltage test with a frequency of 120 to 200 Hz
loss-power measurement at mains frequency, i.e. 50 or 60 Hz.

In the case of the induced voltage test an additional fine tuning of the resonant circuit of the test system according to the invention by variation of the test frequency adjustable by the frequency converter can be carried out, since the test frequency, as mentioned above, may be freely selected within a defined bandwidth. However, in the case of the loss-power measurement a fixed test frequency is stipulated by the relevant IEC. Here, a precise matching between capacitance and inductance is required. Since the capacitor of the capacitor bank, as similarly mentioned above, can be adjusted only in discrete steps, i.e. not continuously, in accordance with the invention an additional adjustable choke for fine tuning the test circuit is provided. This is because, as a counter-move, the inductor thereof is adjustable continuously over a specific range. However, this continuously adjustable range is relatively small and does not balance out the production tolerances of the electrical parameters of the test object of up to 5%.

A method able to be performed by the test system according to the invention is therefore proposed in which by the discretely adjustable capacitors of the capacitor bank effect a coarse adjustment of the test system in that by an iterative process individual capacitors of the capacitor bank are switched on when a below-threshold capacitance is measured in the test system by a measuring device and individual capacitors are switched off when an above-threshold capacitance is measured by the measuring device, until a predetermined threshold value of an above-threshold capacitance prevails, so that fine tuning of the test system is subsequently carried out by the continuously adjustable inductor in such a way that the stated components together with the test object forming an inductor form a series-resonant circuit tunable to its resonant frequency.

BRIEF DESCRIPTION OF THE DRAWING

The invention will be explained in more detail in the following by way of example on the basis of drawings, in which:

FIG. 1 shows a test system known from the prior art for a high-voltage apparatus, as described above, and FIG. 2 shows a test system according to the invention for a high-voltage apparatus.

SPECIFIC DESCRIPTION OF THE INVENTION

A test system according to the invention for a high-voltage apparatus, particularly as shown as an inductor in the electrical equivalent circuit diagram, is shown in FIG. 2. The test system comprises an energy source 8 for electrical power supply that can be, for example, the existing power mains. In FIG. 2 the energy source 8 is connected with inputs of a frequency converter 9 that can be a conventional proprietary frequency converter. Instead of energy supply at the power mains side in interaction with a frequency converter 9 the test system according to the invention can alternatively also be operated by a motor-generator set 10. The motor-generator set 10 has within the test system the task of adapting and regulating frequency and voltage for the test system. The motor-generator set 10 thus represents an equivalent known to the expert to the frequency converter 9. The outputs of the frequency converter 9 or of the motor-generator set 10 are in that case connected with a primary 11.1 of a test transformer 11. The electrical input variables of the test transformer 11 are, depending on embodiment, 5 kV-20 kV, 50 Hz for loss-power testing or 200 Hz for induced voltage testing. The embodiment of the motor-generator set 10 is oriented toward the local conditions of the energy supply that leads to a multiplicity of variants. The test field is frequently supplied by an industrial energy supply mains (three-phase alternating voltage, 50 Hz, 10 kV—20 kV). In this case the motor is constructed as an electrical machine, preferably as a synchronous machine. If a high-power electrical energy supply mains is not present, then use can be made instead of a diesel motor in order to thus replace the energy source. The motor together with a generator are mounted on a common shaft. The kinetic energy is converted in the generator into an electrical energy and delivered to the test transformer 11. In the most frequent cases the generator is a synchronous machine. The exact embodiment, i.e. salient pole machine or non-salient pole machine, pole pair number, is oriented toward the rotational speed of the connected shaft and thus to the embodiment of the motor.

A test object 12, namely a shunt reactor shown as an inductor in it's the electrical circuit diagram is connected with a secondary 11.2 of the test transformer 11. In departure from the prior art illustrated in FIG. 1, the test system according to the invention has on the secondary 11.2 of the test transformer 11 a continuously adjustable inductor 13 as well as a capacitor 14 adjustable in discrete steps, the two of which are integrated as a series circuit in the test system to form a series-resonant circuit together with the test object 12 forming an inductor.

In order to reduce the voltage of the test object 12 to measurable values a voltage divider connected with an evaluator unit (not illustrated) is provided between the test object 12 and the secondary 11.2 of the test transformer 11.

In the case of the method able to be performed by the test system according to the invention a coarse adjustment of the test system is effected by the discretely adjustable capacitors 14 of the capacitor bank in that individual capacitors 14 of the capacitor bank are switched on by an iterative process when a below-threshold capacitance in the test system is measured by a test device or individual capacitors are switched off when an above-threshold capacitance is measured by the measuring device, until a predetermined threshold value of an above-threshold capacitance prevails, so that subsequently the continuously adjustable inductor 13 fine tunes the test system in such a manner that the mentioned components together with the inductive test object 12 form a series-resonant circuit that can be tuned to the resonance point thereof.

The invention claimed is:

1. A system for testing induced voltage and power loss of a high-voltage shunt reactor having a constant inductance, the test system comprising:
   an energy source for electrical supply of the test system,
   a frequency converter electrically connected with the energy source or a motor-generator set electrically connected with the energy source for varying frequency and voltage within the test system,
   a test transformer having a primary electrically connected with the frequency converter or with the motor-generator set and a secondary electrically connected with the shunt reactor, and
   a continuously adjustable inductor and a capacitor adjustable in discrete steps connected in series to the secondary of the test transformer and forming with the reactor a series-resonant circuit tunable to a respective resonant frequency.

2. The test system according to claim 1, wherein the continuously adjustable inductor is an adjustable choke.

3. The test system according to claim 1, wherein the capacitor adjustable in discrete steps is a capacitor bank.

4. The test system according to claim 1, further comprising:
   a voltage divider between the secondary side of the test transformer and the shunt reactor.

5. A method of testing induced voltage and voltage loss of a shunt reactor having a constant inductance with a test system having:
   an energy source for electrical supply of the test system,
   a frequency converter or motor-generator set electrically connected with the energy source for varying frequency and voltage within the test system, and
   a test transformer having a primary electrically connected with the frequency generator or motor-generator set and a secondary electrically connected with the shunt reactor, the test transformer transforming the electrical energy of the motor-generator set into a test voltage,
the method comprising the steps of:
   providing in the test system between the secondary of the transformer and the shunt reactor a bank of capacitors adjustable in discrete steps and a continuously variable inductor connected in series therewith and forming therewith a series-resonant circuit having a respective resonant frequency,
   coarsely adjusting the test system by individual capacitors of the bank of capacitors adjustable in discrete steps by switching in individual capacitors of the bank in an iterative process when a below-threshold capacitance in the test system is measured by a measuring device or switching out individual capacitors of the capacitor bank when an above-threshold capacitance is measured by the measuring device until a predetermined threshold value of an above threshold capacitance prevails, and
   subsequently fine tuning the test system by the continuously adjustable inductor in such a manner that the series-resonant circuit formed by the bank of capacitors and the continuously adjustable inductor is tunable to the respective resonant frequency of the series-resonant circuit.

* * * * *